(12) United States Patent
Tsai

(10) Patent No.: US 9,702,357 B2
(45) Date of Patent: Jul. 11, 2017

(54) HEAT DISSIPATION DEVICE

(71) Applicant: Hsien-Chin Su, Tainan (TW)

(72) Inventor: Chang-Lin Tsai, Taipei (TW)

(73) Assignee: Hsien-Chin Su, Tainan (TW)

( * ) Notice: Subject to any disclaimer, the term of this patent is extended or adjusted under 35 U.S.C. 154(b) by 323 days.

(21) Appl. No.: 14/509,661

(22) Filed: Oct. 8, 2014

(65) Prior Publication Data
US 2015/0152859 A1 Jun. 4, 2015

(30) Foreign Application Priority Data
Dec. 2, 2013 (TW) .............................. 102144014 A

(51) Int. Cl.
*F04B 45/04* (2006.01)
*F04B 45/047* (2006.01)
*H05K 7/20* (2006.01)
*G06F 1/20* (2006.01)

(52) U.S. Cl.
CPC ............ *F04B 45/043* (2013.01); *F04B 45/04* (2013.01); *F04B 45/041* (2013.01); *F04B 45/047* (2013.01); *G06F 1/20* (2013.01); *H05K 7/20172* (2013.01)

(58) Field of Classification Search
CPC ...... F04B 45/043; F04B 45/04; F04B 45/041; F04B 45/047; G06F 1/20; H05K 7/20172; F04D 33/00; F04D 35/00; H01L 23/467; H01L 33/645; H01L 41/094
USPC ........................................................... 416/3
See application file for complete search history.

(56) References Cited

U.S. PATENT DOCUMENTS

| | | | | |
|---|---|---|---|---|
| 2,646,261 A * | 7/1953 | Poirot | .................. | A01K 63/042 261/121.2 |
| 4,063,826 A * | 12/1977 | Riepe | .................... | F04D 33/00 417/410.1 |
| 4,162,876 A * | 7/1979 | Kolfertz | ............... | A01K 63/042 310/25 |
| 4,834,619 A * | 5/1989 | Walton | .................... | F04D 33/00 416/81 |
| 4,923,000 A * | 5/1990 | Nelson | .................... | F04D 33/00 165/122 |
| 5,522,712 A * | 6/1996 | Winn | ....................... | F04D 33/00 310/25 |
| 6,043,978 A * | 3/2000 | Mody | ....................... | H01H 9/52 165/185 |
| 8,322,889 B2 * | 12/2012 | Petroski | .................. | F04D 33/00 361/694 |
| 9,011,113 B2 * | 4/2015 | Ma | .......................... | F04D 33/00 417/410.2 |
| 2009/0045700 A1 * | 2/2009 | Sasaki | .................. | B06B 1/0603 310/348 |

(Continued)

*Primary Examiner* — Ninh H Nguyen
*Assistant Examiner* — Aaron R Eastman
(74) *Attorney, Agent, or Firm* — Li & Cai Intellectual Property (USA) Office

(57) ABSTRACT

A heat dissipation device includes an air current producing unit and an electromagnet unit separately disposed on a substrate. The air current producing unit includes a resilient fan body mounted to the substrate and having an unrestrained end, and a magnetic component disposed on the fan body. The electromagnet unit is configured to generate a varying magnetic field that acts on the magnetic component so as to cause the fan body to sway, thereby producing air current.

14 Claims, 13 Drawing Sheets

(56) References Cited

U.S. PATENT DOCUMENTS

| | | | |
|---|---|---|---|
| 2011/0063800 A1* | 3/2011 | Park | F04D 33/00 |
| | | | 361/697 |
| 2011/0259557 A1* | 10/2011 | Chao | F04B 43/046 |
| | | | 165/121 |
| 2014/0166235 A1* | 6/2014 | Von Heimendahl | F04D 33/00 |
| | | | 165/80.3 |
| 2014/0166260 A1* | 6/2014 | Roebke | H05K 7/20209 |
| | | | 165/244 |
| 2015/0173241 A1* | 6/2015 | Hsu | H05K 7/20209 |
| | | | 165/287 |
| 2015/0247686 A1* | 9/2015 | Akalanne | H01L 23/467 |
| | | | 165/84 |
| 2015/0285270 A1* | 10/2015 | Buckland | F04D 33/00 |
| | | | 92/67 |

\* cited by examiner

HEAT DISSIPATION DEVICE

CROSS-REFERENCE TO RELATED APPLICATION

This application claims priority to Taiwanese Application No. 102144014, filed on Dec. 2, 2013.

BACKGROUND OF THE INVENTION

1. Field of the Invention

The invention relates to a heat dissipation device.

2. Description of the Related Art

Due to rapid development of electronic products, such as notebook computers, desktop computers, tablet computers, etc., performance of electronic components (e.g., central processing unit) have been greatly promoted while the sizes of the electronic components are to remain the same or are reduced, resulting in more heat production per unit area. Without effective heat dissipation, an excessively high temperature may have adverse effects on operation of the electronic components (which are called heating components hereinafter), such as abnormal shutdown. A conventional solution is to install a cooling fan on the heating component to lower an ambient temperature for assisting in heat dissipation for the heating component. However, the cooling fans in the market are made in several standard sizes, and may not be adapted for various sizes of different heating components, resulting in ineffective heat dissipation. In other words, the cooling fans have difficulty in terms of customization.

SUMMARY OF THE INVENTION

Therefore, an object of the present invention is to provide a heat dissipation device that has a structure facilitating customization for various sizes of different heating components.

According to the present invention, a heat dissipation device comprises:

a substrate having a mounting surface;

an air current producing unit disposed on the mounting surface and including
  a fan body that is resilient and that has amounting end mounted to the mounting surface, and an unrestrained end opposite to the mounting end, and
  a magnetic component that is disposed on the fan body; and an electromagnet disposed on the mounting surface, spaced apart from the air current producing unit, and configured to generate a varying magnetic field that acts on the magnetic component so as to cause the fan body to sway, thereby producing air current.

BRIEF DESCRIPTION OF THE DRAWINGS

Other features and advantages of the present invention will become apparent in the following detailed description of embodiments with reference to the accompanying drawings, of which.

DETAILED DESCRIPTION OF THE EMBODIMENTS

Figure 1:
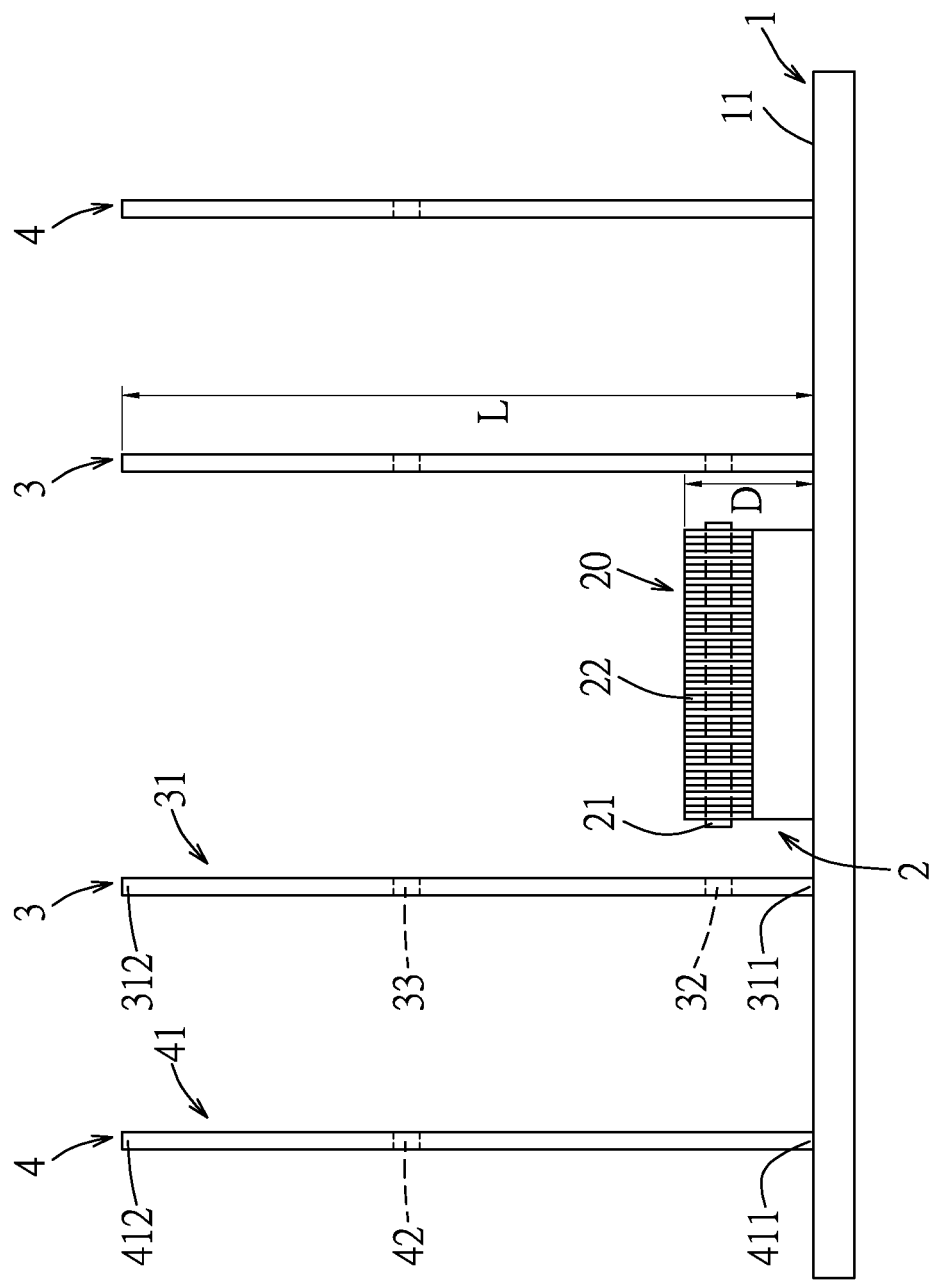
FIG. 1 is a schematic diagram showing a first embodiment of a heat dissipation device according to the present invention.

Referring to FIG. 1, the first embodiment of the heat dissipation device according to this invention is adapted to dissipate heat generated by at least one heating component 9 (see FIG. 4), and includes a substrate 1, an electromagnet unit 2, a pair of first air current producing units 3, and a pair of second air current producing units 4.

The electromagnet unit 2 is disposed on a mounting surface 11 of the substrate 1, and includes an electromagnet 20 composed of a core 21 and a coil 22 wound around the core 21. The coil 22 receives, but not limited to, from a power source (not shown) a periodic electrical power, whose waveform may be a square wave, a triangular wave or a sine wave, or which may be an alternating current (AC) electrical power with positive and negative half cycles. When an electric current flows through the coil 22, the core 21 cooperates with the coil 22 to generate a varying magnetic field. In this embodiment, the core 21 is made of iron.

The first air current producing units 3 are spaced apart from and disposed at opposite sides of the electromagnet 20 on the mounting surface 11. The second air current producing units 4 are disposed at the opposite sides of the electromagnet 20 on the mounting surface 11, and are respectively spaced apart from the first air current producing units 3. Compared to the first air current producing units 3, the second air current producing units 4 are disposed farther from the electromagnet 20. In other words, each of the second air current producing units 4 is disposed on one side of a respective one of the first air current producing unit 3 opposite to the electromagnet 20. Preferably, the electromagnet unit 2 has an end distal from the mounting surface 11 and spaced apart from the mounting surface 11 by a distance D not greater than one-third of a length L of each of the first air current producing units 3 in a direction transverse to the mounting surface 11, i.e., D≤1/3L, so that the first air current producing units 3 may have a preferable swaying range.

In this embodiment, each of the first air current producing units 3 has a fan body 31, a first magnetic component 32 and a second magnetic component 33. The fan body 31 is resilient and has a mounting end 311 mounted to the mounting surface 11, and an unrestrained end 312 opposite to the mounting end 311. In this embodiment, the length L of each first air current producing unit 3 refers to a distance between the mounting end 311 and the unrestrained end 312 of the fan body 31. For each of the first air current producing units 3, the first magnetic component 32 is disposed on the fan body 31 at a position corresponding to the electromagnet 20. Preferably, the first magnetic component 32 is aligned with the core 21 in distance with respect to the mounting surface 11. The second magnetic component 33 is disposed on the fan body 31 farther from the mounting surface 11 than the first magnetic component 32, and is spaced apart from the first magnetic component 32 along a direction from the mounting end 311 to the unrestrained end 312 of the fan body 31.

In this embodiment, each of the second air current producing units 4 has a fan member 41 and a magnetic member 42. The fan member 41 has a configuration similar to the fan body 31 of the first air current producing unit 3, and thus has a mounting end 411 mounted to the mounting surface 11, and an unrestrained end 412 opposite to the mounting end 411. The magnetic member 42 is disposed on the fan member 41 at a position corresponding to the second magnetic component 33. Preferably, the magnetic member 42 is aligned with the second magnetic component 33 in distance with respect to the mounting surface 11.

In this embodiment, each of the first magnetic components 32, the second magnetic components 33 and the magnetic members 42 is a permanent magnet. For adjacent first and second air current producing units 3, 4, a magnetic polarity of a portion of the second magnetic component 33 that is adjacent to the second air current producing unit 4 is the same as that of a portion of the magnetic member 42 that is adjacent to the first air current producing unit 3, so that the second magnetic component 33 and the magnetic member 42 are mutually repulsive.

Referring to FIG. 1, when the periodic electrical power is not provided to the coil 22, the heat dissipation device of the first embodiment is in an initial state, in which the electromagnet 20 is unable to drive movement of the first air current producing units 3, so that the first and second air current producing units 3 and 4 do not sway.

Hereinafter, operation of the heat dissipation device according to this embodiment is described using the first and second air current producing units 3, 4 that are disposed at the same side of the electromagnet unit 2.

Figure 2:
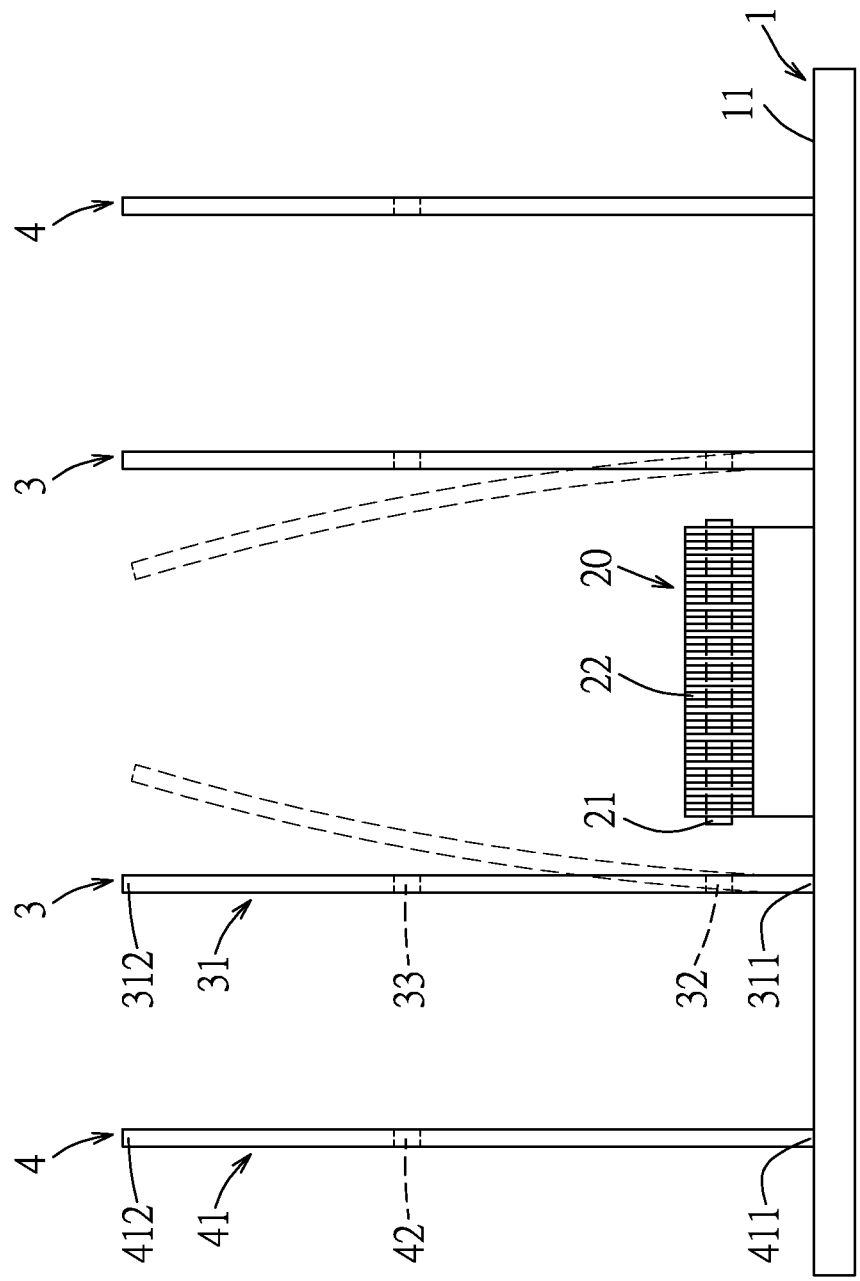
FIGS. 2, 3A and 3B are schematic diagrams to illustrate operation of the first embodiment.
Figure 3A:
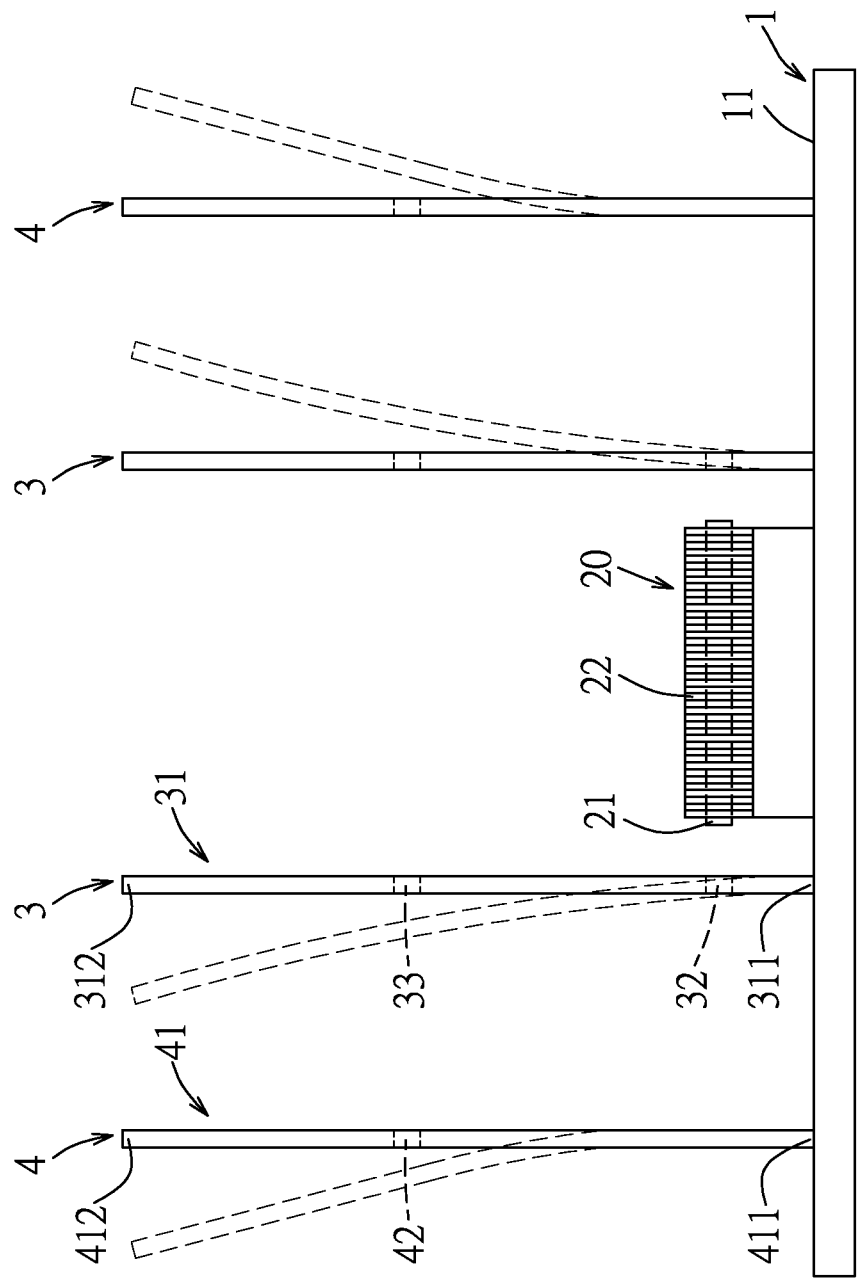
Figure 3B:
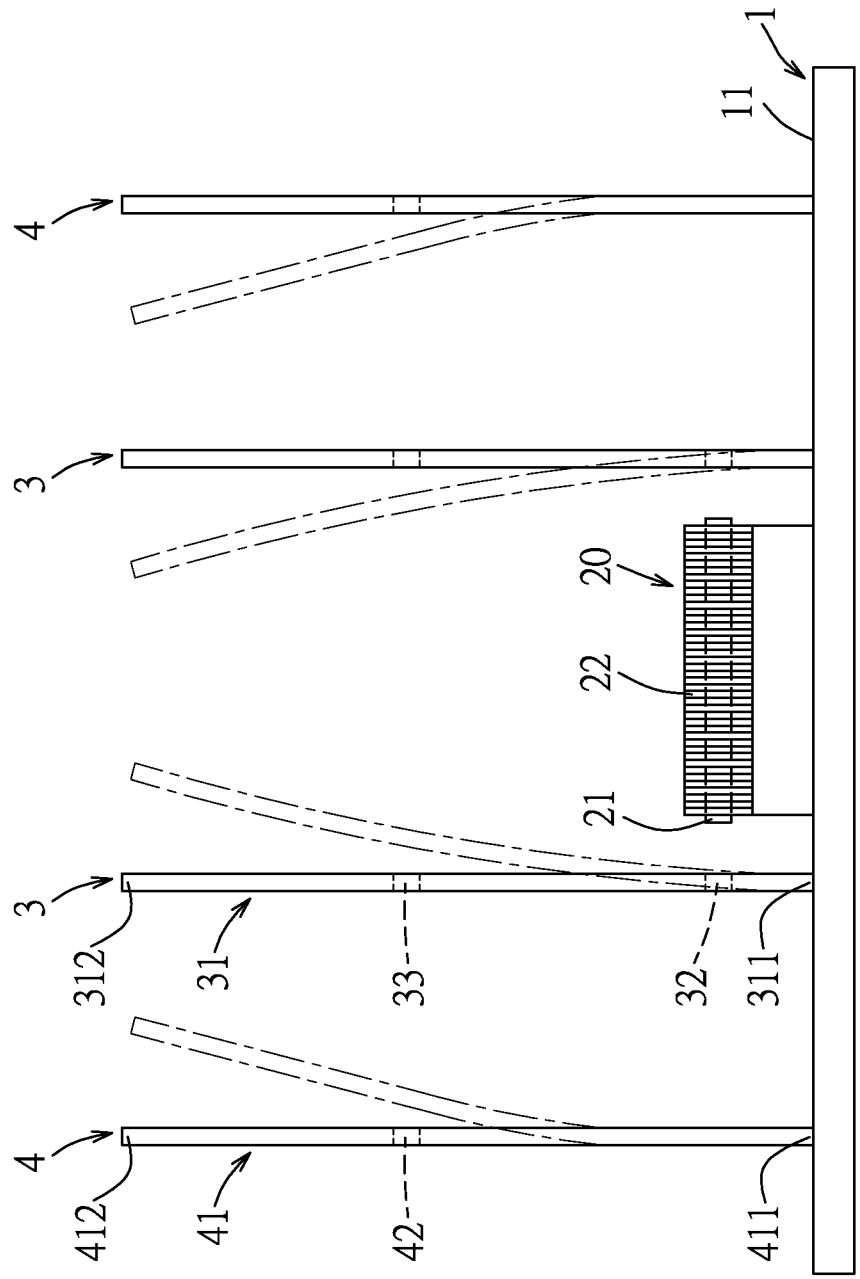
Figure 4:
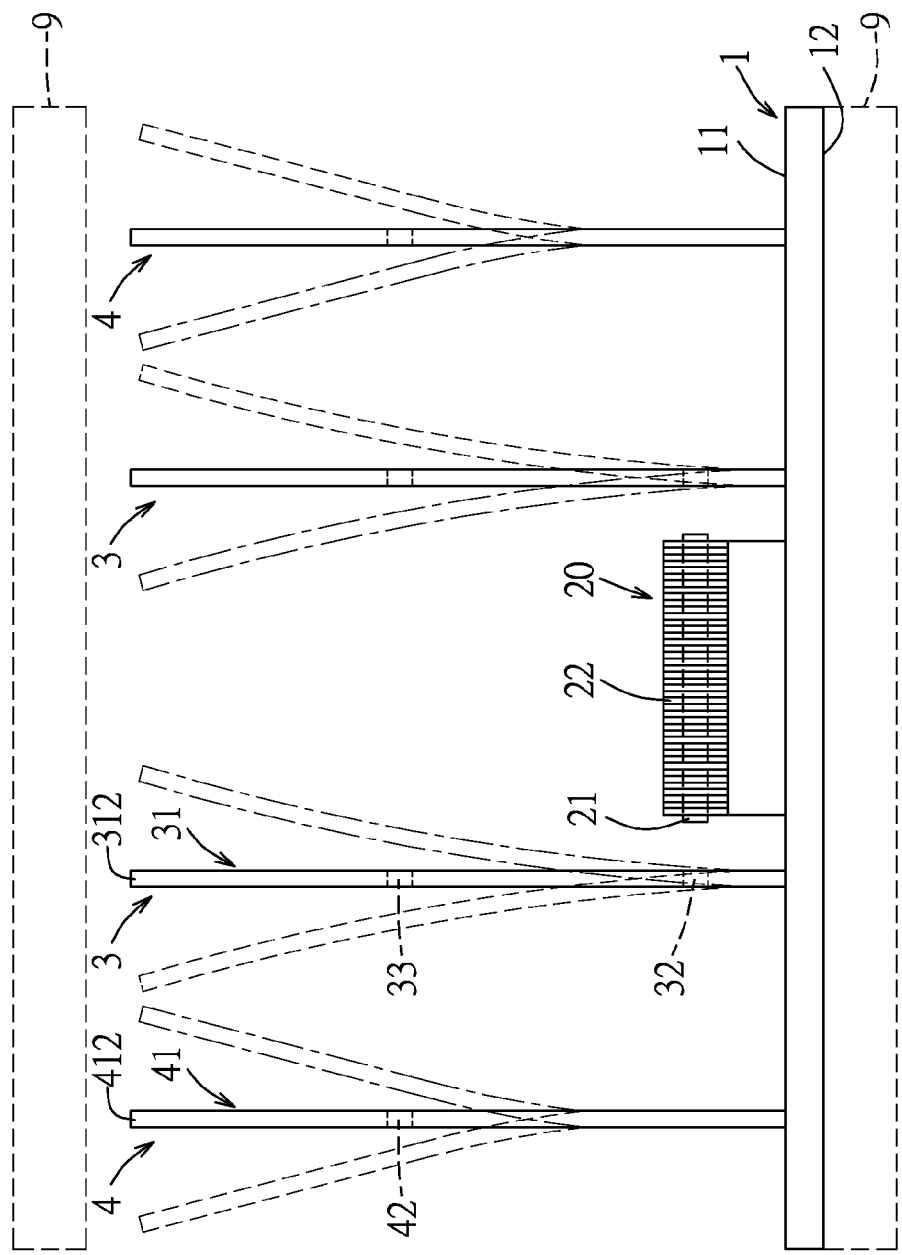
FIG. 4 is a schematic diagram to illustrate operation of the first embodiment in different applicable conditions.

Referring to FIGS. 2 to 4, when the periodic electrical power is applied to the coil 22, the electromagnet 20 generates the varying magnetic field, such that the first magnetic component 32 is acted upon magnetic attraction or repulsion by the electromagnet 20 to move toward or away from the electromagnet 20.

Referring to FIG. 2, when the electromagnet 20 generates a magnetic field attractive to the first magnetic component 32, the first magnetic component 32 moves toward the electromagnet 20, thereby causing the fan body 31 to bend toward the electromagnet 20. At this time, the magnetic member 42 does not move since the second magnetic component 33 moves away from the magnetic member 42. Referring to FIG. 3A, when the electromagnet 20 generates a magnetic field repulsive to the first magnetic component 32, the first magnetic component 32 moves away from the electromagnet 20, thereby causing the fan body 31 to bend toward the adjacent second air current producing unit 4. At this time, the magnetic member 42 moves to a direction same as the second magnetic component 33 due to magnetic repulsion by the second magnetic component 33, thereby causing the fan member 41 to bend away from the electromagnet 20, and to store a resiliently restoring force since the fan member 42 is made of a resilient material. Referring to FIG. 3B, after the condition illustrated in FIG. 3A, the electromagnet 20 generates a magnetic field attractive to the first magnetic component 32, so that the fan body 31 bends toward the electromagnet 20. At this time, the fan member 41 releases the restoring force due to reduced/removed magnetic repulsion between the second magnetic component 33 and the magnetic member 42, and bends toward the first air current producing unit 3. Referring to FIG. 4, in other words, the varying magnetic field generated by the electromagnet 20 acts on the first magnetic component 32 so as to cause the fan body 31 to sway, and the magnetic member 42 is acted upon by the second magnetic component 33 when the fan body 31 sways so as to cause the fan member 41 to sway, thereby producing air current.

Referring to FIG. 4, in one application, the heat dissipation device of this embodiment may be installed such that the heating component 9 is proximate to the unrestrained ends 312, 412 of the fan bodies 31 and the fan members 41 of the first and second air current producing units 3, 4. Air currents generated by swaying of the fan bodies 31 and the fan members 41 may be provided to the heating component 9 for heat dissipation. In another application, the substrate 1, the first air current producing units 3 and the second air current producing units 4 may be made of thermal conductive materials with good thermal conductivity, and the heat dissipation device of this embodiment may be installed such that the heating component 9 is disposed on a surface 12 of the substrate 1 that is opposite to the mounting surface 11. By virtue of the thermal conductive materials and swaying of the fan bodies 31 and the fan members 41, heat dissipation for the heating component 9 may be enhanced.

Figure 5:
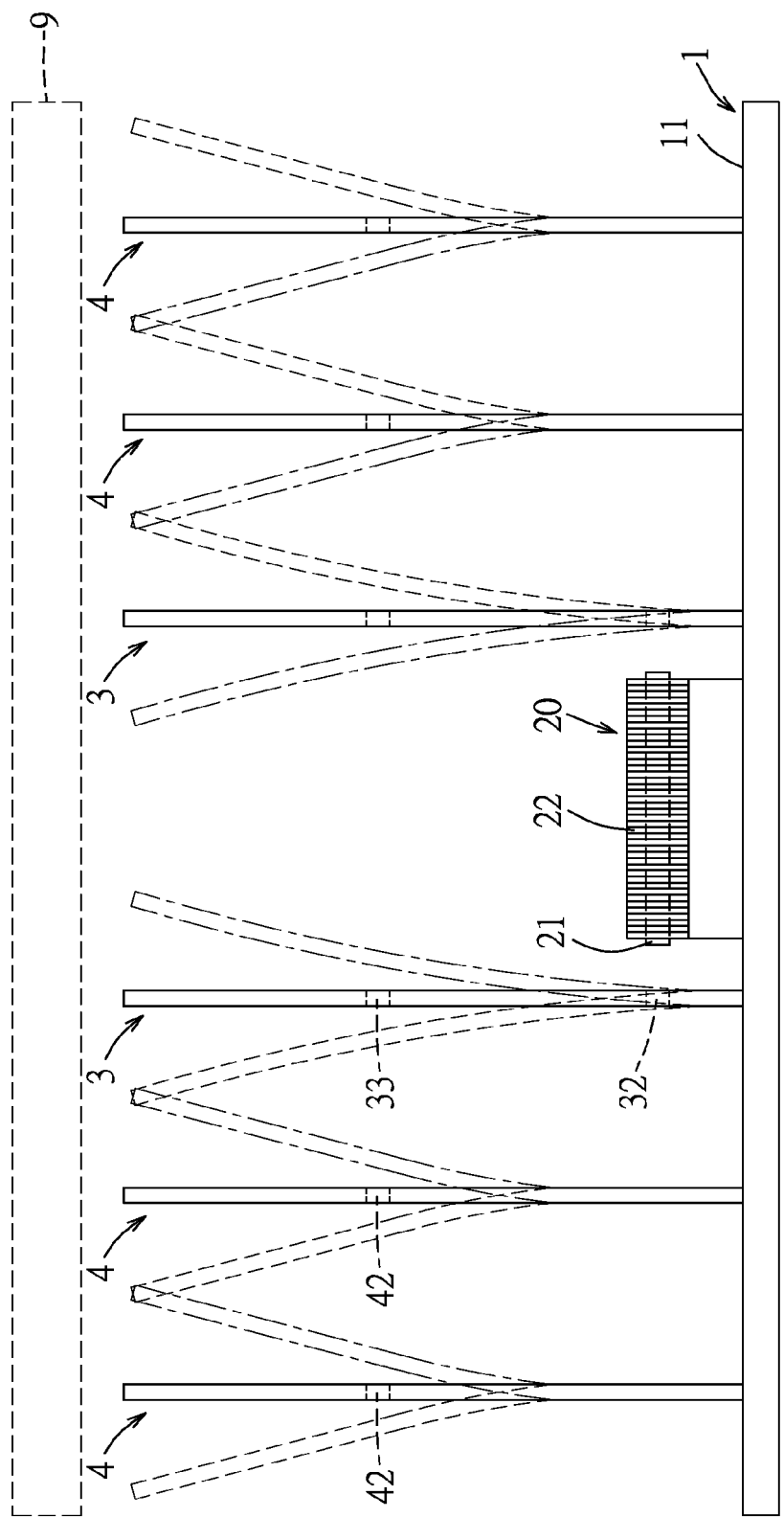
FIG. 5 is a schematic diagram to illustrate application of the first embodiment to a longer heating component.
Figure 6:
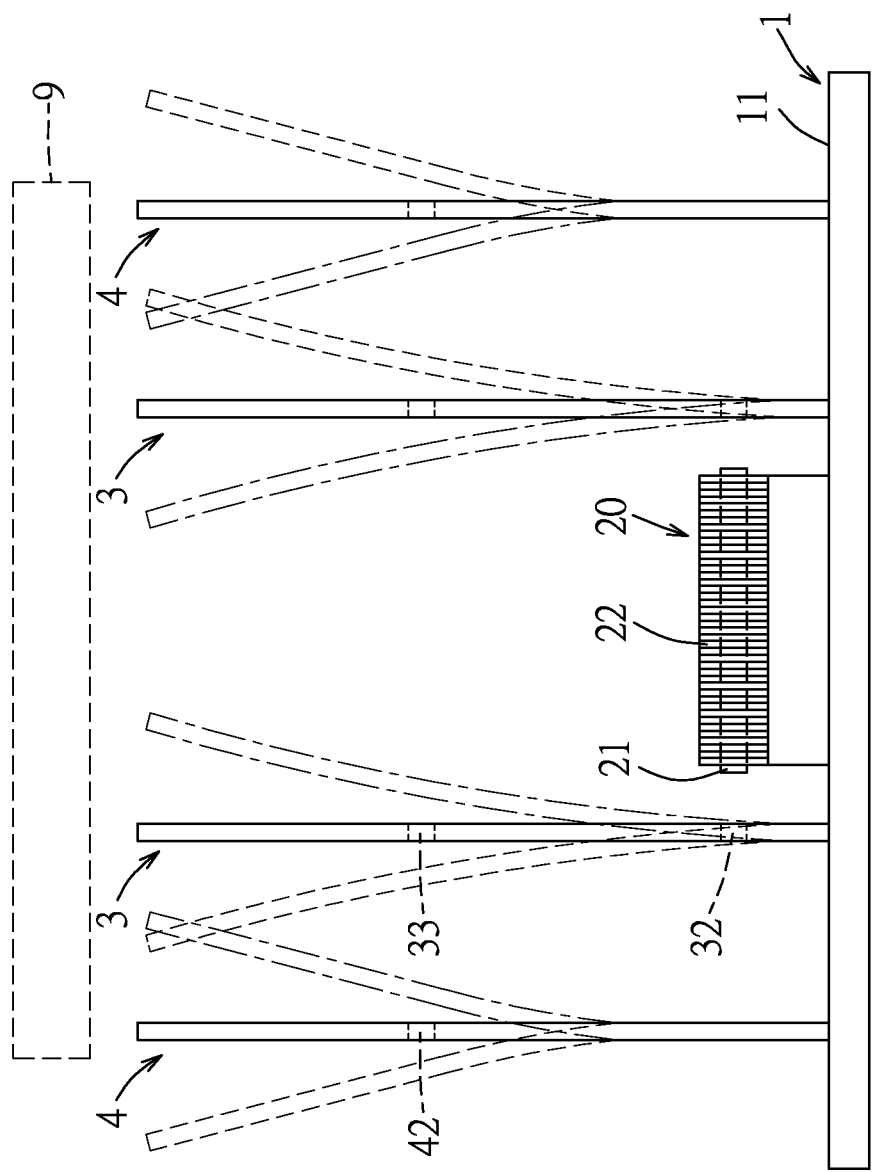
FIG. 6 is a schematic diagram to illustrate application of the first embodiment to a shorter heating component.

The structural design of the heat dissipation device according to this embodiment may assist in customization for the heating components 9 with different sizes. Referring to FIG. 5, for a longer heating component 9, a number of the second air current producing units 4 may be increased, or distances among the first air current producing units 3 and the second air current producing units 4 may be made wider. In contrast, as shown in FIG. 6, for a shorter heating component 9, a number of the second air current producing units 4 may be reduced, or distances among the first air current producing units 3 and the second air current producing units 4 may be made narrower.

Figure 7:
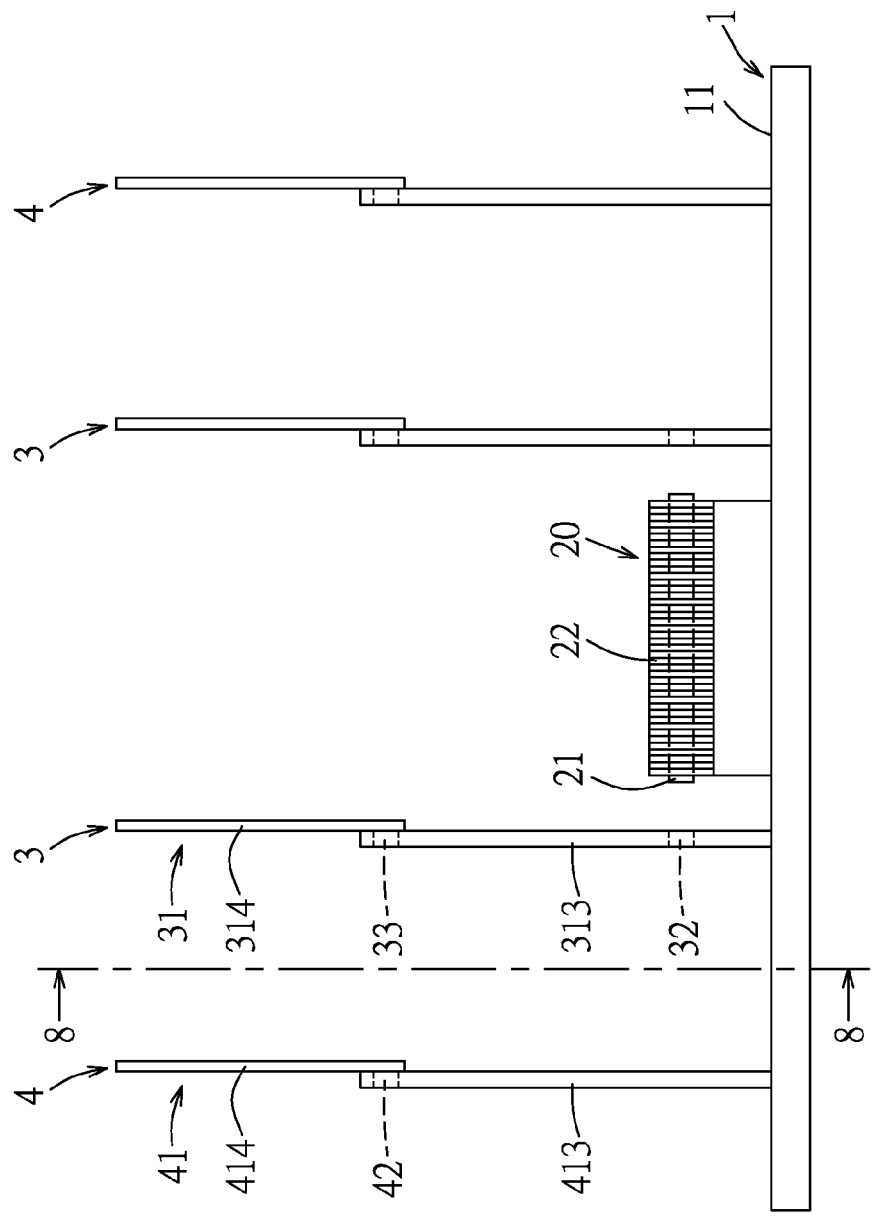
FIG. 7 is a schematic diagram showing a second embodiment of a heat dissipation device according to the present invention.
Figure 8:
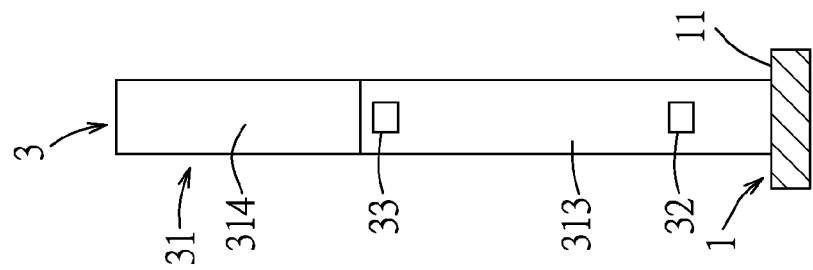
FIG. 8 is a sectional view of the second embodiment taken along line 8-8 in FIG. 7.
Figure 9:
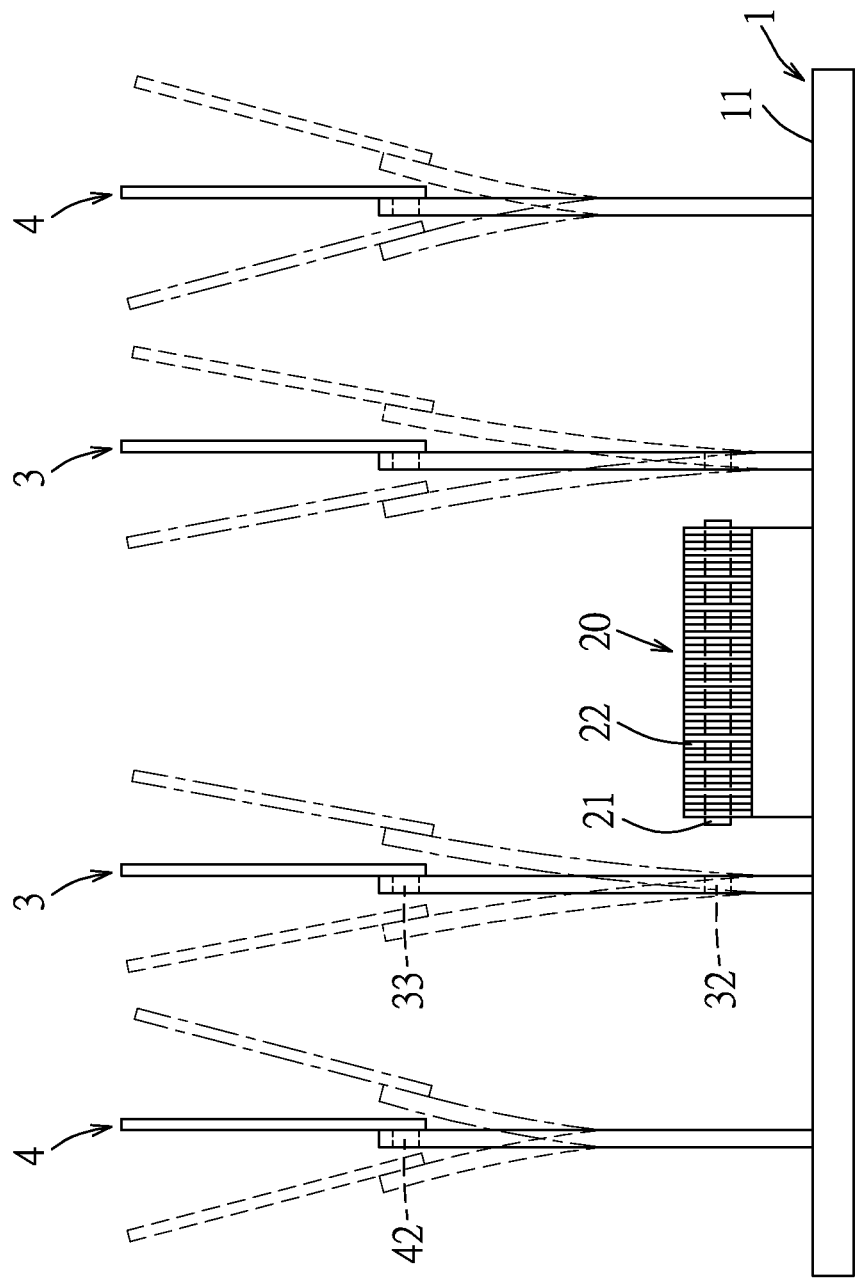
FIG. 9 is a schematic diagram to illustrate operation of the second embodiment.

Referring to FIGS. 7 to 9, a second embodiment of a heat dissipation device according to the present invention is shown to have a configuration similar to that of the first embodiment. In the second embodiment, each of the fan bodies 31 and the fan members 41 has a first segment 313, 413 and a second segment 314, 414 that are connected together and that are respectively proximate to and distal from the mounting surface 11. For each of the first air current producing units 3, both of the first and second magnetic components 32, 33 are disposed on the first segment 313. For each of the second air current producing units 4, the magnetic member 42 is disposed on the first segment 413. Preferably, each of the second magnetic components 33 and the magnetic members 42 is not limited to be disposed at a joining portion of the first segment 313, 413 and the second segment 314, 414 of the respective one of the fan bodies 31 and the fan members 41, and may be disposed at a position higher than the joining portion (i.e., the second segment 314, 414) or lower than the joining portion (i.e., the first segment 313, 413).

Each of the first segments 313, 413 and the second segments 314, 414 may be made of copper, aluminum, a copper alloy, a plastic material, a wood material (e.g., balsa wood), carbon fiber, a magnesium alloy, etc. Moreover, each of the second segments 314, 414 may be made of a paperboard. Preferably, for each of the fan bodies 31 and the fan members 41, the first segment 313, 413 has a Young's modulus greater than that of the second segment 314, 414. Preferably, a length of the first segment 313, 413 in a direction transverse to the mounting surface 11 is longer than that of the second segment 314, 414, to thereby achieve an optimal swaying effect. A ratio of the length of the first segment 313, 413 to the length of the second segment 314, 414 may be adjusted according to space requirements of the intended application.

Operation of the second embodiment is similar to the first embodiment, and a description thereof is not repeated herein for the sake of brevity. Referring to FIG. 9, according to the Euler-Bernoulli beam theory, for each of the first segments 313, 413 and the second segments 314, 414, a swaying range is negatively correlated with the Young's modulus thereof, and a swaying frequency is positively correlated with the Young's modulus thereof. Under a condition that other factors associated with the swaying range and the swaying frequency are the same, since the Young's modulus of the first segment 313, 413 is greater than that of the second segment 314, 414, the first segment 313, 413 may have a higher swaying frequency and the second segment 314, 414 may have a larger swaying range. Swaying of the first segment 313, 413 may drive swaying of the second segment 314, 414, so that the higher swaying frequency of the first segment 313, 413 may enhance the swaying frequency of the second segment 314, 414, and cooperates with the larger swaying range of the second segment 314, 414 to produce greater air current, resulting in good heat dissipation. In addition to the first segment 313, 413 having the Young's modulus greater than that of the second segment 314, 414, the first segment 313, 413 is preferable to have a density smaller than that of the second segment 314, 414. In this embodiment, under a condition in which other factors remain unchanged, each of the first segments 313, 413 is made of carbon fiber, and each of the second segments 314, 414 is made of a polyester film.

Figure 10:
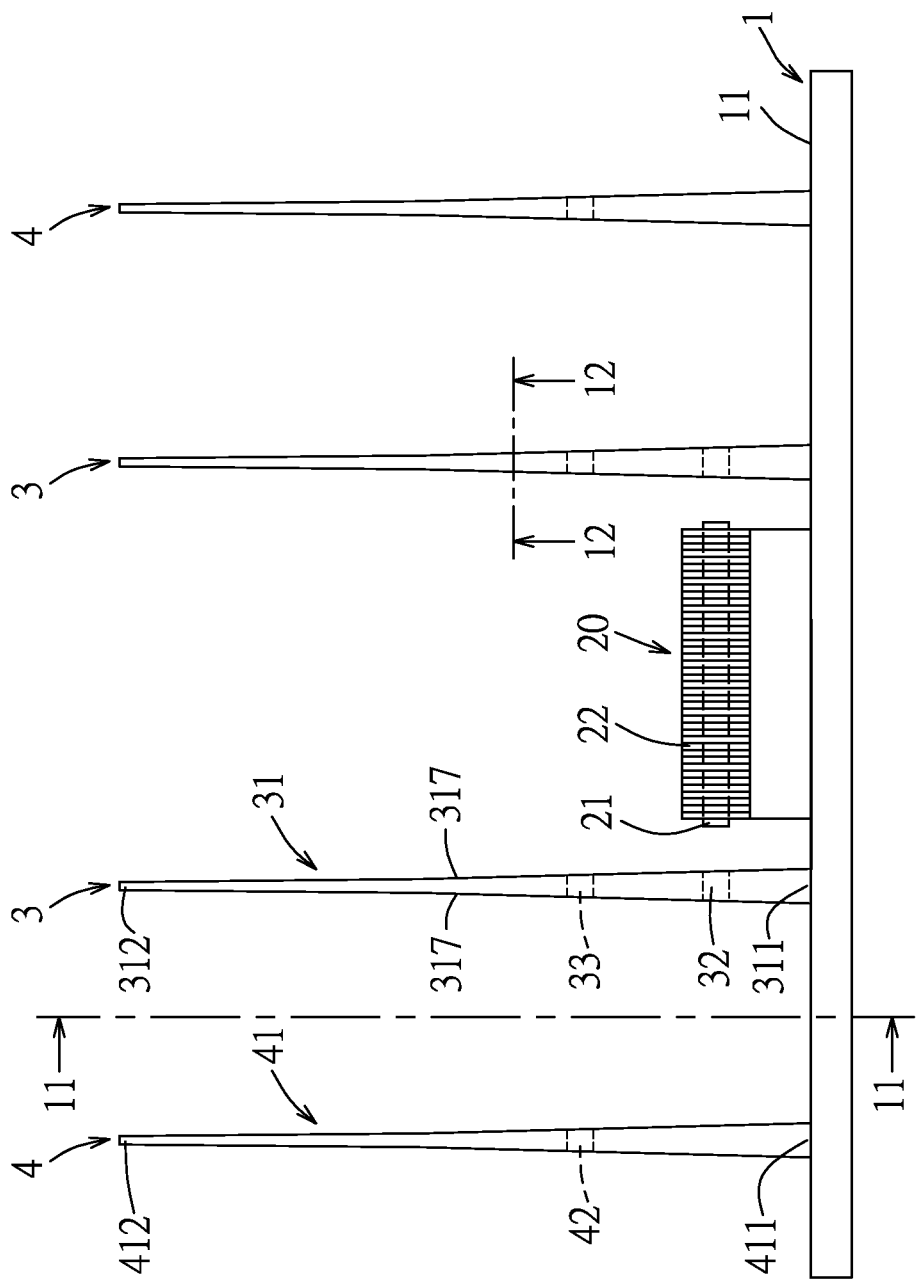
FIG. 10 is a schematic diagram showing a third embodiment of a heat dissipation device according to the present invention.
Figure 12:
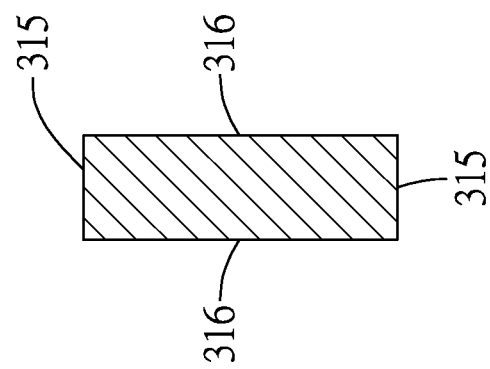
FIG. 12 is a sectional view of the third embodiment taken along line 12-12 in FIG. 10.
Figure 11:
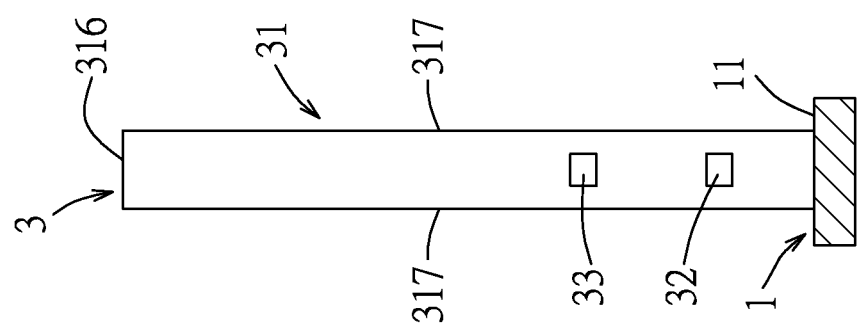
FIG. 11 is a sectional view of the third embodiment taken along line 11-11 in FIG. 10.

Referring to FIGS. 10 to 12, a third embodiment of a heat dissipation device according to the present invention is shown to be similar to the first embodiment. Note that scales of components shown in FIGS. 11 and 12 may differ from those shown in FIG. 10 for clear illustration of detailed structures of the components.

In the third embodiment, each of the fan bodies 31 and the fan members 41 is formed as a sheet. In this embodiment, the fan members 41 and the fan bodies 31 have the same configuration, so that only the fan body 31 will be described in detail, and detailed descriptions for the fan member 41 are omitted herein for the sake of brevity. Each fan body 31 has a four-sided cross-section that is surrounded by edges 315, 316, that is parallel to the mounting surface 11 and that is gradually reduced in a direction from the mounting end 311 to the unrestrained end 312. That is, the fan body 31 has four side edges 317 that extend between the mounting end 311 and the unrestrained end 312. A weight per unit length of the fan body 31 is gradually reduced in a direction from the mounting end 311 to the unrestrained end 312. When the fan body 31 has a uniform density, the weight per unit length is positively correlated with the volume per unit length (i.e., a cross-sectional area), so that each of the side edges 317 may be a slanting straight line, a concave curve, etc. The side edges 317 are preferable to be concave curves for achieving better effect in reducing the volume per unit length of the fan body 31 in the direction from the mounting end 311 to the unrestrained end 312.

In this embodiment, although a cross-section of the fan body 31 is gradually reduced in the direction from the mounting end 311 to the unrestrained end 312, the length of each of the edges 316 is constant, so as to obtain a better area to produce sufficient air current.

Operation of the third embodiment is similar to the first embodiment, and a description thereof is not repeated herein for the sake of brevity. In the third embodiment, each of the fan bodies 31 and the fan members 41 is made of a single material, that is, a material property thereof is uniform. According to the Euler-Bernoulli beam theory, under a condition of the single Young's modulus and the single material, a size of the cross-section (i.e., a product of lengths of the edges 315, 316) may influence the swaying frequency and the swaying range. For each of the fan bodies 31 and the fan members 41, since a first portion thereof that is proximate to the mounting surface 11 has a cross-section greater than that of a second portion thereof that is distal from the mounting surface 11, the first portion may have a higher swaying frequency and a smaller swaying range compared to the second portion. However, the higher swaying frequency of the first portion may enhance the swaying frequency of the second portion that has a larger swaying range, thereby producing sufficient air current and resulting in good heat dissipation.

Figure 13:
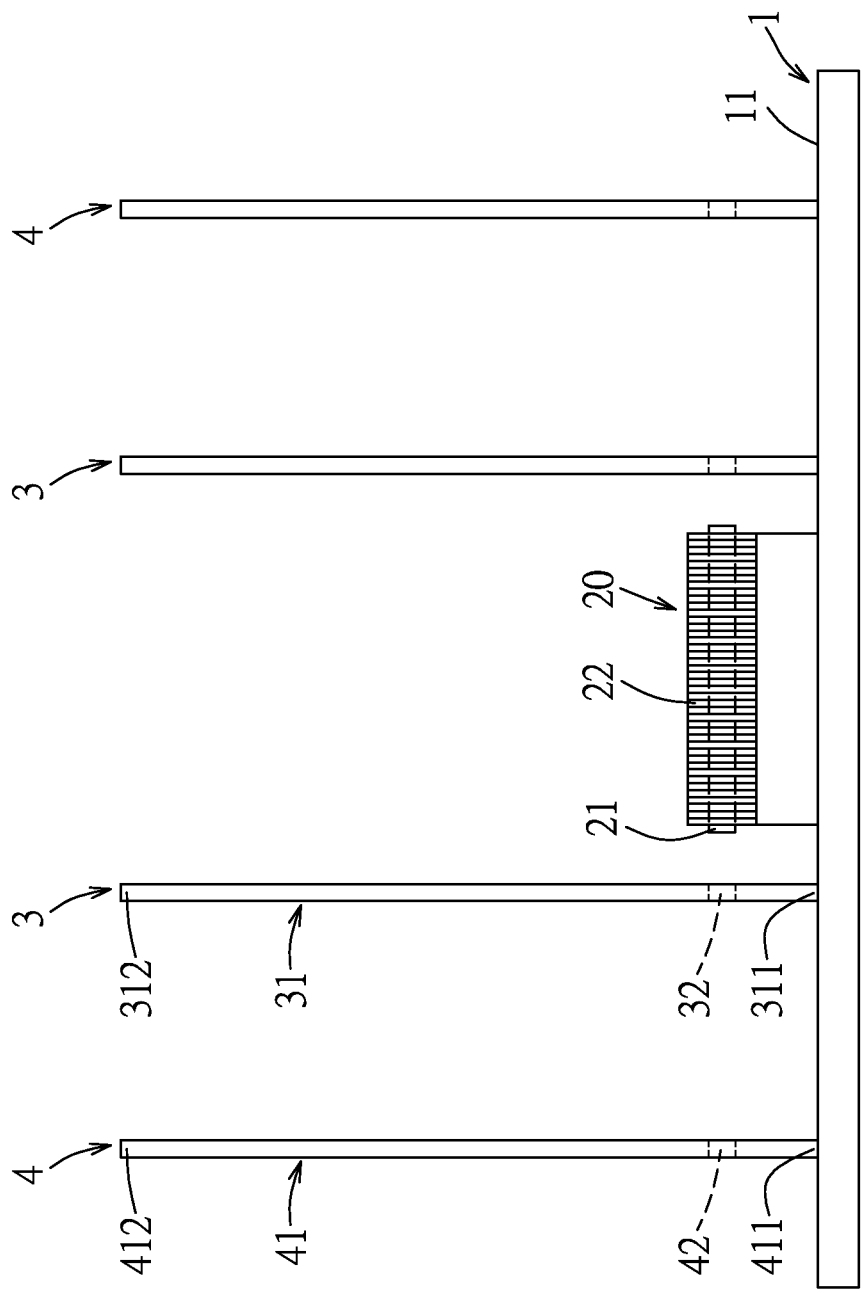
FIG. 13 is a schematic diagram showing a fourth embodiment of a heat dissipation device according to the present invention.
Figure 14:
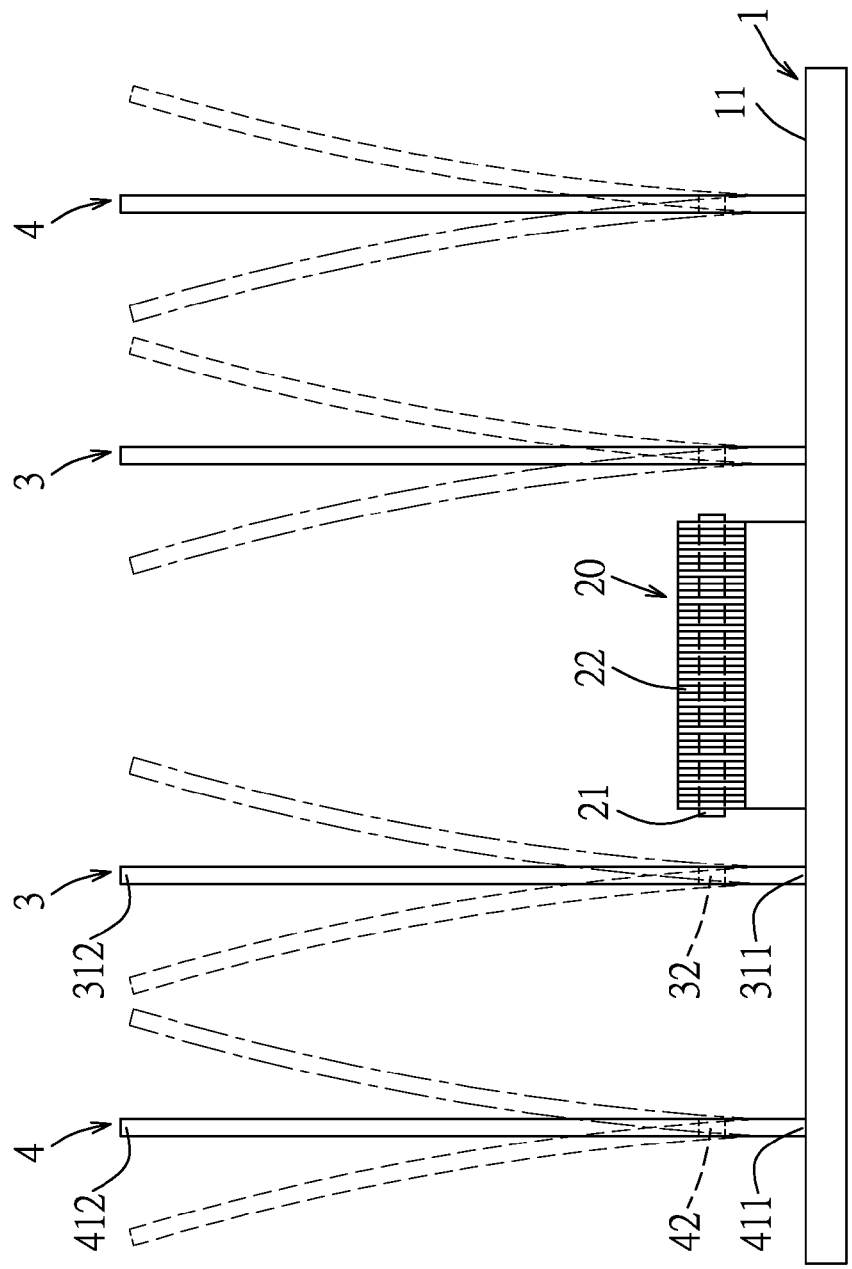
FIG. 14 is a schematic diagram to illustrate operation of the fourth embodiment.

Referring to FIGS. 13 and 14, a fourth embodiment of a heat dissipation device according to the present invention is shown to be similar to the first embodiment.

However, in the fourth embodiment, the second magnetic component 33 (see FIG. 1) of each first air current producing unit 3 is omitted, and the magnetic member 42 of each second air current producing unit 4 is disposed on the fan member 41 at a position corresponding to the magnetic component 32 of the respective one of the first air current producing units 3. Preferably, the magnetic member 42 is aligned with the magnetic component 32 in distance with respect to the mounting surface 11. For adjacent first and second air current producing units 3, 4, a magnetic polarity of a portion of the magnetic component 32 that is adjacent to the second air current producing unit 4 is the same as that of a portion of the magnetic member 42 that is adjacent to the first air current producing unit 3, so that the magnetic component 32 and the magnetic member 42 are mutually repulsive. Operation of the fourth embodiment is similar to the first embodiment, and a description thereof is not repeated herein for the sake of brevity.

It should be noted that, although each of the disclosed embodiments includes two first air current producing units 3, the present invention should not be limited in this respect. In other embodiments, the heat dissipation device according to this invention may include only one first air current producing unit 3.

In summary, for a longer heating component 9, the number of the second air current producing units 4 may be increased, or the distances among the first air current producing units 3 and the second air current producing units 4 may be made wider. For a shorter heating component 9, a number of the second air current producing units 4 may be reduced, or distances among the first air current producing units 3 and the second air current producing units 4 may be made narrower. The structure of the heat dissipation device according to this invention may be adjusted according to a size of the heating component 9, thereby facilitating customization.

While the present invention has been described in connection with what are considered the most practical embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A heat dissipation device, comprising:
a substrate having a mounting surface;
a first air current producing unit disposed on said mounting surface and including
a fan body that is resilient and that has a mounting end mounted to said mounting surface, and an unrestrained end opposite to said mounting end, and
a first magnetic component that is disposed on said fan body; and
an electromagnet unit disposed on said mounting surface, and including an electromagnet that is spaced apart from said first air current producing unit, and that is configured to generate a varying magnetic field acting on said first magnetic component so as to cause said fan body to sway, thereby producing air current,
wherein said first air current producing unit further includes a second magnetic component disposed on said fan body and spaced apart from said first magnetic component along a direction from said mounting end to said unrestrained end of said fan body;
said heat dissipation device further comprising a second air current producing unit disposed on said mounting surface spaced apart from said first air current producing unit and said electromagnet, and including:
a fan member that is resilient and that has a mounting end mounted to said mounting surface, and an unrestrained end opposite to said mounting end of said fan member, and
a magnetic member that is disposed on said fan member at a position corresponding to said second magnetic component and that is acted upon by said second magnetic component when said fan body of said first air current producing unit sways so as to cause said fan member of said second air current producing unit to sway, thereby producing air current,
wherein at least one of said fan body and said fan member has a first portion and a second portion that are respectively proximate to and distal from said mounting surface, said first portion having a weight per unit length in a direction from said mounting end to said unrestrained end heavier than that of said second portion.

2. The heat dissipation device as claimed in claim 1, wherein said first magnetic component is disposed on said fan body at a position corresponding to said electromagnet.

3. The heat dissipation device according to claim 1, wherein said second air current producing unit is disposed on one side of said first air current producing unit opposite to said electromagnet.

4. The heat dissipation device according to claim 1, wherein said second magnetic component and said magnetic member are configured to be mutually repulsive.

5. The heat dissipation device according to claim 1, wherein said first magnetic component is disposed closer to said mounting surface than said second magnetic component.

6. The heat dissipation device according to claim 1, wherein at least one of said fan body and said fan member has a cross-section that is gradually reduced in a direction from said mounting end to said unrestrained end.

7. The heat dissipation device according to claim 1, wherein at least one of said fan body and said fan member is formed as a sheet, and has a four-sided cross-section that is parallel to said substrate.

8. The heat dissipation device according to claim 1, wherein at least one of said fan body and said fan member has at least one concave edge that extends between said mounting end and said unrestrained end.

9. The heat dissipation device according to claim 1, comprising two of said first air current producing units disposed at opposite sides of said electromagnet.

10. The heat dissipation device according to claim 9, further comprising two of said second air current producing units disposed on said mounting surface at the opposite sides of said electromagnets.

11. A heat dissipation device, comprising:
a substrate;
a first air current producing unit disposed on said substrate and including
a fan body that is resilient and that has a mounting end mounted to said substrate, and an unrestrained end opposite to said mounting end, and
a first magnetic component that is disposed on said fan body; and
an electromagnet unit disposed on said substrate, and including an electromagnet that is spaced apart from said first air current producing unit, and that is configured to generate a varying magnetic field acting on said first magnetic component so as to cause said fan body to sway, thereby producing air current,
wherein said first air current producing unit further includes a second magnetic component disposed on said fan body and spaced apart from said first magnetic component along a direction from said mounting end to said unrestrained end of said fan body; said heat dissipation device further comprising a second air current producing unit disposed on said substrate, spaced apart from said first air current producing unit and said electromagnet, and including:
a fan member that is resilient and that has a mounting end mounted to said substrate, and an unrestrained end opposite to said mounting end of said fan member, and
a magnetic member that is disposed on said fan member at a position corresponding to said second magnetic component and that is acted upon by said second magnetic component when said fan body of said first air current producing unit sways so as to cause said fan member of said second air current producing unit to sway, thereby producing air current,
wherein at least one of said fan body and said fan member has a first segment and a second segment that are respectively proximate to and distal from said substrate, said first segment having a Young's modulus greater than that of said second segment.

12. The heat dissipation device according to claim 11, wherein said first segment has a density smaller than that of said second segment.

13. The heat dissipation device according to claim 11, wherein said first magnetic component is disposed on said first segment of said fan body.

14. A heat dissipation device, comprising:
a substrate;

a first air current producing unit disposed on said substrate and including a fan body that is resilient and that has a mounting end mounted to said substrate, and an unrestrained end opposite to said mounting end, and
a first magnetic component that is disposed on said fan body; and
an electromagnet unit disposed on said substrate, and including an electromagnet that is spaced apart from said first air current producing unit, and that is configured to generate a varying magnetic field acting on said first magnetic component so as to cause said fan body to sway, thereby producing air current,
wherein a core of said electromagnet unit has an end distal from said substrate and spaced apart from said substrate by a distance not greater than one-third of a distance between said mounting end and said unrestrained end of said fan body.

* * * * *